(12) United States Patent
Kenning et al.

(10) Patent No.: US 11,349,505 B2
(45) Date of Patent: *May 31, 2022

(54) SYSTEMS AND METHODS FOR TRANSCEIVER COEXISTENCE FILTERING

(71) Applicant: Tyco Safety Products Canada Ltd., Concord (CA)

(72) Inventors: James Thomas Kenning, Scarborough (CA); Jun Xu, Scarborough (CA); Steven Seung Chul Lee, Richmond Hill (CA)

(73) Assignee: JOHNSON CONTROLS TYCO IP HOLDINGS LLP, Milwaukee, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/095,612

(22) Filed: Nov. 11, 2020

(65) Prior Publication Data

US 2021/0067179 A1 Mar. 4, 2021

Related U.S. Application Data

(63) Continuation of application No. 16/415,682, filed on May 17, 2019, now Pat. No. 10,911,074.

(51) Int. Cl.
*H04B 1/00* (2006.01)
*H03H 9/54* (2006.01)
*H03H 7/01* (2006.01)

(52) U.S. Cl.
CPC ......... *H04B 1/0057* (2013.01); *H03H 7/0115* (2013.01); *H03H 9/547* (2013.01)

(58) Field of Classification Search
CPC combination set(s) only.
See application file for complete search history.

(56) References Cited

U.S. PATENT DOCUMENTS

| | | | |
|---|---|---|---|
| 8,600,436 B2 | 12/2013 | Haartsen | |
| 2008/0166980 A1* | 7/2008 | Fukamachi | H04B 1/50 455/83 |
| 2008/0212552 A1 | 9/2008 | Fukamachi et al. | |
| 2010/0197235 A1 | 8/2010 | Wilhelmsson | |
| 2012/0083216 A1* | 4/2012 | Kenington | H04B 1/0057 455/63.1 |

(Continued)

*Primary Examiner* — Junpeng Chen
(74) *Attorney, Agent, or Firm* — ArentFox Schiff LLP

(57) ABSTRACT

A wireless communication device includes a first transceiver operable according to a first radio technology and a second transceiver operable according to a second radio technology and operable concurrently with the first transceiver. The wireless communication device further includes an antenna configured to transmit radio transmissions of the second transceiver, and a filter circuit coupling the second transceiver with the antenna. The filter circuit includes a first frequency path and a second frequency path in parallel. The first frequency path passes a first set of frequencies of the radio transmissions and the second frequency path passes a second set of frequencies of the radio transmissions. One of the first frequency path or the second frequency path is configured to filter the radio transmissions of the second transceiver to remove signals corresponding to the one or more operating frequencies of the first transceiver from the radio transmissions of the second transceiver.

23 Claims, 7 Drawing Sheets

(56) References Cited

U.S. PATENT DOCUMENTS

| | | | |
|---|---|---|---|
| 2014/0055210 A1* | 2/2014 | Black | H04B 1/525 333/132 |
| 2015/0105120 A1* | 4/2015 | Lim | H04B 1/0064 455/552.1 |
| 2017/0063404 A1* | 3/2017 | Langer | H04B 1/0057 |
| 2017/0237452 A1* | 8/2017 | Granger-Jones | H04B 1/0057 370/297 |
| 2019/0158193 A1 | 5/2019 | Jain et al. | |
| 2019/0306805 A1 | 10/2019 | Hasnain et al. | |
| 2019/0378640 A1* | 12/2019 | Cheng | H01F 19/04 |

* cited by examiner

SYSTEMS AND METHODS FOR TRANSCEIVER COEXISTENCE FILTERING

CROSS-REFERENCE TO RELATED APPLICATIONS

This application is a continuation of U.S. application Ser. No. 16/415,682, filed May 17, 2019, entitled "SYSTEMS AND METHODS FOR TRANSCEIVER COEXISTENCE FILTERING," the entirety of which is incorporated herein by reference.

BACKGROUND

The present disclosure relates generally to wireless communication, and more particularly, to systems and methods for coexistence of multiple transceivers.

Generally, some wireless communication devices may include multiple transceivers that operate according to different radio technologies. For example, a communication device used in an Internet of Things (IoT) system, such as a smart home automation and alarm security system, may include various, concurrently-operating radio transceivers that are implemented according to various radio technologies. Such concurrent operation may cause the multiple transceivers to interfere with one another and thereby cause performance degradation to one or more of the transceivers. Thus, improvements are desired in wireless communication systems.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

The present disclosure provides systems, apparatuses, and methods that allow for coexistence of multiple concurrently-operating transceivers in a wireless communication device.

In an aspect, a wireless communication device includes a first transceiver operable according to a first radio technology including one or more operating frequencies. The wireless communication device further includes a second transceiver operable according to a second radio technology different than the first radio technology, where the second transceiver further is operable concurrently with the first transceiver. The wireless communication device further includes an antenna configured to transmit radio transmissions of the second transceiver. The wireless communication device further includes a filter circuit coupling the second transceiver with the antenna, where the filter circuit includes a first frequency path and a second frequency path in parallel to one another. The first frequency path is configured to pass a first set of frequencies of the radio transmissions, and the second frequency path configured to pass a second set of frequencies of the radio transmissions. The first set of frequencies are less than and non-overlapping with the second set of frequencies. One of the first frequency path or the second frequency path is configured to filter the radio transmissions of the second transceiver to remove signals corresponding to the one or more operating frequencies of the first transceiver from the radio transmissions of the second transceiver.

In another aspect, a filter circuit coupling a transceiver with an antenna that is configured to transmit radio transmissions of the transceiver is provided. The filter circuit includes an input path configured to receive an output signal of the transceiver. The filter circuit further includes a first frequency path connected to the input path and including a filter configured to block out a first frequency from the output signal of the transceiver to define a first path output signal. The filter causes a first insertion loss at the first frequency in the first path output signal, where the first insertion loss is less than a first acceptable insertion loss threshold associated with the transceiver at the first frequency. The filter further causes a second insertion loss at a second frequency in the first path output signal, where the second insertion loss is greater than a second acceptable insertion loss threshold associated with the transceiver at the second frequency. The filter circuit further includes a second frequency path connected to the input path and configured in parallel with the first frequency path. The second frequency path is configured to block the first frequency and pass the second frequency to define a second path output signal. The filter circuit further includes an output path connected to the first frequency path and the second frequency path and connectable to the antenna. The output path is configured to receive and output the first path output signal of the first frequency path and the second path output signal of the second frequency path.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1A:
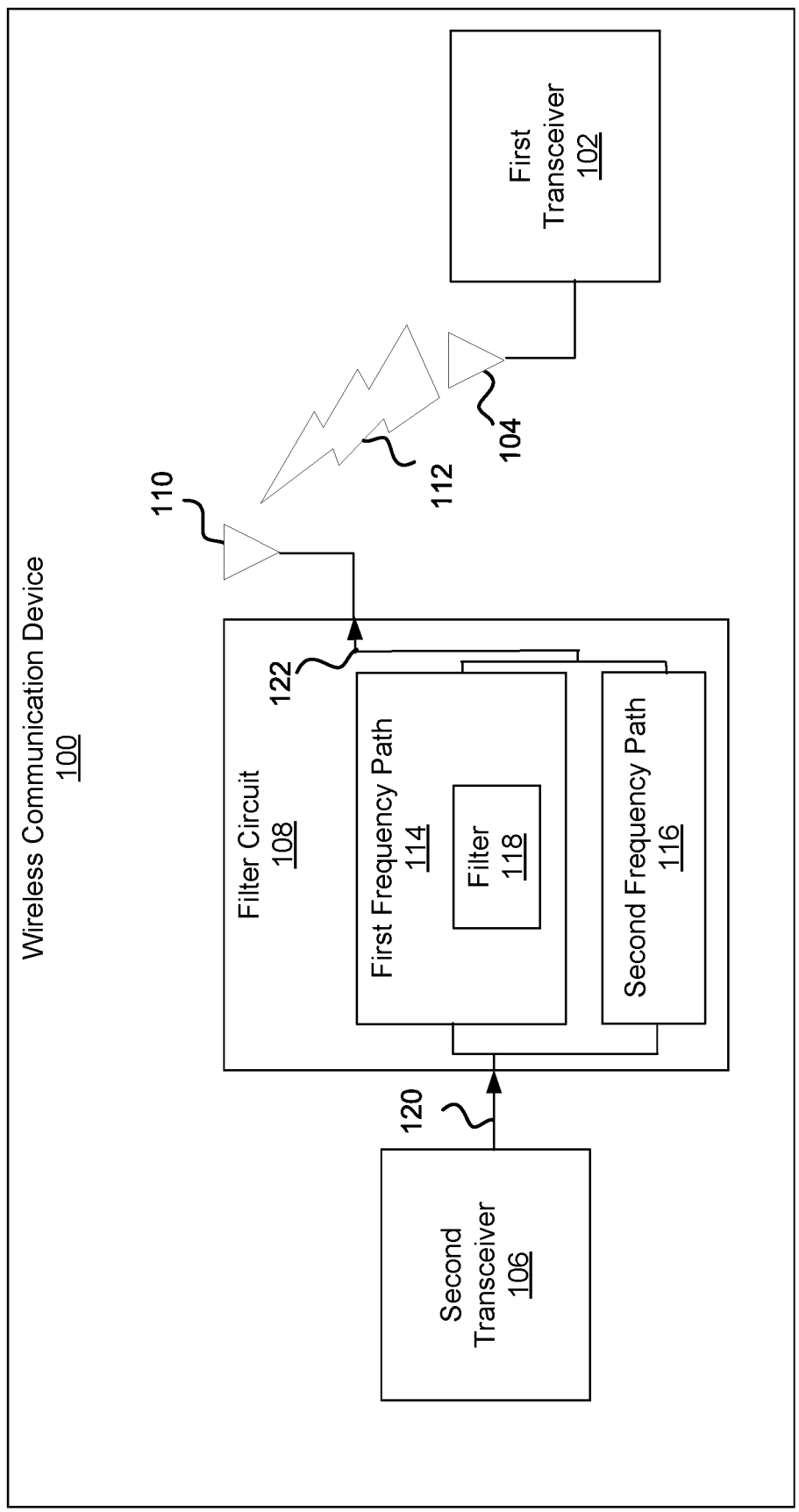
FIG. 1A is a schematic diagram of an example wireless communication device that includes multiple transceivers that concurrently operate according to different radio technologies.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components may be shown in block diagram form in order to avoid obscuring such concepts.

Aspects of the present disclosure provide apparatuses, methods, and systems that allow for coexistence of multiple, concurrently-operating transceivers in a wireless communication device by providing a filter circuit that cancels out an interfering frequency while meeting signal insertion loss requirements. In one non-limiting aspect, for example, a low cost filter circuit may be coupled with a cellular transceiver of a wireless communication device to mitigate cellular interference to 868 MHz, 915 MHz, and/or other industrial, scientific, and medical (ISM) radio band transceivers collocated and concurrently operating with the cellular transceiver in the wireless communication device. For example, in an aspect, an ISM transceiver of the wireless communication device may operate at one or more operating frequencies, in which case the filter circuit may be configured to remove such frequencies from the radio transmissions of a cellular transceiver of the same wireless communication device. In order to maintain acceptable insertion loss in the signal from the cellular transceiver, the filter circuit may be configured to provide a first frequency path and a second frequency path in parallel to one another. The first frequency path may include a filter that blocks a first frequency at an acceptable insertion loss to the cellular transceiver, but causes an unacceptable insertion loss to the cellular transceiver at a second frequency. Accordingly, the second frequency path may be configured to block the first frequency and pass the second frequency at an acceptable insertion loss to the cellular transceiver. Hence, the combination of the first frequency path and the second frequency path in parallel provides a signal for transmission having an acceptable insertion loss to the cellular transceiver both at the first frequency and at the second frequency.

It should be understood that the described filter circuit may be applied to any combination of two or more radio technology transceivers, e.g., cellular, ISM, Bluetooth, PowerG, Zigbee, etc., such that two or more different radio technologies may coexist on a device without having their transmissions interfere with one another. For instance, a transceiver that transmits signals including one or more frequencies that interference with one or more other transceivers may be configured with a corresponding one or more of the described filter circuits configured to filter out the corresponding interfering frequencies while maintaining an acceptable level of insertion loss.

Turning now to the figures, example aspects are depicted with reference to one or more components described herein, where components in dashed lines may be optional.

Referring to FIG. 1A, in one non-limiting aspect, for example, a wireless communication device 100 includes a first transceiver 102 and a second transceiver 106 that operate concurrently to transmit and/or receive radio signals.

In an aspect, for example, the first transceiver 102 may be operable according to a first radio technology in one or more operating frequencies, and the second transceiver may be operable according to a second radio technology that causes interference to the first transceiver 102 at the one or more operating frequencies.

The wireless communication device 100 further includes a filter circuit 108 that is coupled with the second transceiver 106 and is configured to filter the one or more operating frequencies out of radio transmissions 112 transmitted by a second transceiver antenna 110 of the second transceiver 106 and received by a first transceiver antenna 104 of the first transceiver 102. As such, the filter circuit 108 reduces or eliminates interference caused to the first transceiver 102 by the second transceiver 106 during concurrent operation, thereby improving co-existence of the transceivers on the wireless communication device 100.

Specifically, in an aspect, the filter circuit 108 may include a first frequency path 114 and a second frequency path 116 configured in parallel to one another to split an input path 120 configured to receive an output signal of the second transceiver 106 to enable at least one of the paths to make up for an insertion loss deficiency in the other path. For example, the first frequency path 114 may include a filter 118 configured to block a first frequency out of radio transmissions 112 of the second transceiver 106, where the first frequency may be a frequency that interferes with transmission and/or reception of signals by the first transceiver 102. However, the filter 118 may also have an unacceptable insertion loss at one or more other frequencies. Consequently, the second frequency path 116 may be configured to pass the one or more other frequencies with an acceptable insertion loss. As a result, the filter circuit 108 combines the signals output by both the first frequency path 114 and the second frequency path 116 on an output path 122 to produce an output signal for transmission having the interfering frequency removed and also having acceptable insertion loss across the remaining frequencies of the output signal.

More specifically, the filter 118 may cause an acceptable insertion loss to the second transceiver 106 at the first frequency. That is, the filter 118 may cause an insertion loss to the second transceiver 106 at the first frequency where the insertion loss is less than or equal to an acceptable insertion loss threshold associated with the second transceiver 106 at the first frequency. However, if all frequencies output by the second transceiver 106 to the input path 120 are routed through the first frequency path 114, the filter 118 may also cause unacceptable insertion loss to the second transceiver 106 at one or more other frequencies. That is, the filter 118 may cause an insertion loss to the second transceiver 106 at a second frequency, where the insertion loss is greater than an acceptable insertion loss threshold associated with the second transceiver 106 at the second frequency. For example, in one non-limiting aspect, the second transceiver may have a total radiated power (TRP) requirement of 20 dBm. However, the filter 118 may cause an insertion loss of, for example, 3 dB to the second transceiver 106 at the second frequency and bring the TRP of the second transceiver 106 below 20 dBm at the second frequency.

To address any unacceptable insertion loss at the second frequency, in an aspect, the second frequency path 116 may be configured to present high impedance at the first frequency and block the first frequency, while allowing the second frequency to pass without causing unacceptable insertion loss to the second transceiver 106. Therefore, the combination of the first frequency path 114 and the second frequency path 116 in parallel to one another allows the filter circuit 108 to cause acceptable insertion loss to the second transceiver 106 at both the first frequency and the second frequency. Further details of the filter circuit 108 are provided with reference to various example aspects in FIGS. 2-5 below.

In an aspect, for example, the second transceiver 106 may be a cellular transceiver such as a Long Term Evolution (LTE) transceiver, and the first transceiver 102 may be an Industrial, Scientific, and Medical (ISM) radio band transceiver such as a wireless fidelity (Wi-Fi) transceiver, a ZigBee transceiver, a Bluetooth transceiver, a Z-Wave transceiver, a PowerG transceiver, etc. Although only two transceivers are illustrated in FIG. 1A, the present aspects are not such limited, and the wireless communication device 100 may include multiple cellular transceivers and/or multiple non-cellular transceivers. For example, in one non-limiting aspect, the wireless communication device 100 may be a wireless security panel that includes cellular transceivers as well as ISM transceivers operating at 868 MHz or 915 MHz frequency bands.

In an aspect, the radio transmissions 112 transmitted by the second transceiver antenna 110 of the second transceiver 106 may be received by the first transceiver antenna 104 of the first transceiver 102 and therefore cause interference to the first transceiver 102. This may happen, for example, due to limited spectrum resources consumed by the first transceiver 102 and the second transceiver 106, due to limited antenna isolation imposed by mechanical dimensions of a housing of the wireless communication device 100, etc. In an aspect, such interference to the first transceiver 102 may reduce the wireless range of the first transceiver 102 or even make the first transceiver 102 inoperable. This effect may be referred to as "desensitization" or "desense" of the first transceiver 102, and the first transceiver 102 may also be referred to as a "victim" transceiver.

In an aspect, for example, the interference to the first transceiver 102 by the radio transmissions 112 of the second transceiver 106 may depend on an amount of antenna coupling between the first transceiver antenna 104 of the first transceiver 102 and the second transceiver antenna 110 of the second transceiver 106. Such an antenna coupling in dB may in turn depend on an antenna efficiency of the first transceiver antenna 104 and/or the second transceiver antenna 110, and/or a physical distance between the first transceiver antenna and/or the second transceiver antenna 110. In one non-limiting aspect, for example, the filter circuit 108 may be required and implemented in the wireless communication device 100 to reduce interference when an amount of antenna coupling between the first transceiver antenna 104 of the first transceiver 102 and the second transceiver antenna 110 of the second transceiver 106 is more than −10 to −20 dB.

For example, in an aspect, the wireless communication device 100 may be an alarm system configured for operation in Europe. In this case, the first transceiver 102 may be, for example, a PowerG transceiver configured to receive radio signals at one or more operating frequencies such as 868.0-868.6 MHz and/or 868.7-869.2 MHz PowerG radio receiver frequency bands in Europe. Further, the second transceiver 106 may be an LTE B8 transceiver or an extended global system for mobile communications (E-GSM) 900 transceiver configured to operate at 880 MHz cellular frequency band in Europe. Through antenna coupling between the first transceiver antenna 104 of the first transceiver 102 and the second transceiver antenna 110 of the second transceiver 106, the second transceiver 106 may cause wideband interference noise that falls into the one or more operating frequencies of the first transceiver 102, e.g., 868.0-868.6 MHz and/or 868.7-869.2 MHz PowerG radio receiver frequency bands of the first transceiver 102. Such an interference may cause the first transceiver 102 to not operate properly, which may seriously affect the reliability performance of the alarm system implemented by the wireless communication device 100. An LTE B20 transceiver may cause similar interference to a collocated and concurrently operating PowerG transceiver configured for operation in Europe.

Accordingly, in this case, the filter circuit 108 may be configured to provide high rejection at PowerG frequency bands, e.g., at 869 MHz, and also have low insertion loss outside PowerG frequency bands to cause tolerable attenuation in the cellular frequency bands. For example, in an aspect, the filter circuit 108 may need to provide low insertion loss in the frequency ranges 698-960 MHz and 1710-2690 MHz, except in the applicable ISM bands (e.g., 868 MHz for Europe, 915 MHz for North America, 2.4-2.5 GHz for WiFi, etc.).

In an aspect, since the transition bands from PowerG 869 MHz to LTE B20 and LTE B8 (or E-GSM900) are about 7 MHz and 11 MHz, respectively, the filter circuit 108 is also required to operate as a very sharp notch filter. More specifically, since the upper limit of LTE B20 is 862 MHz and the lower limit of LTE B8 is 880 MHz, the required stopband of the filter circuit 108 may be configured in one non-limiting aspect to be, for example, 868-870 MHz. In this case, since the stopband is a very small percentage of the operating frequency, the filter circuit 108 is considered to be "sharp."

Figure 1B:
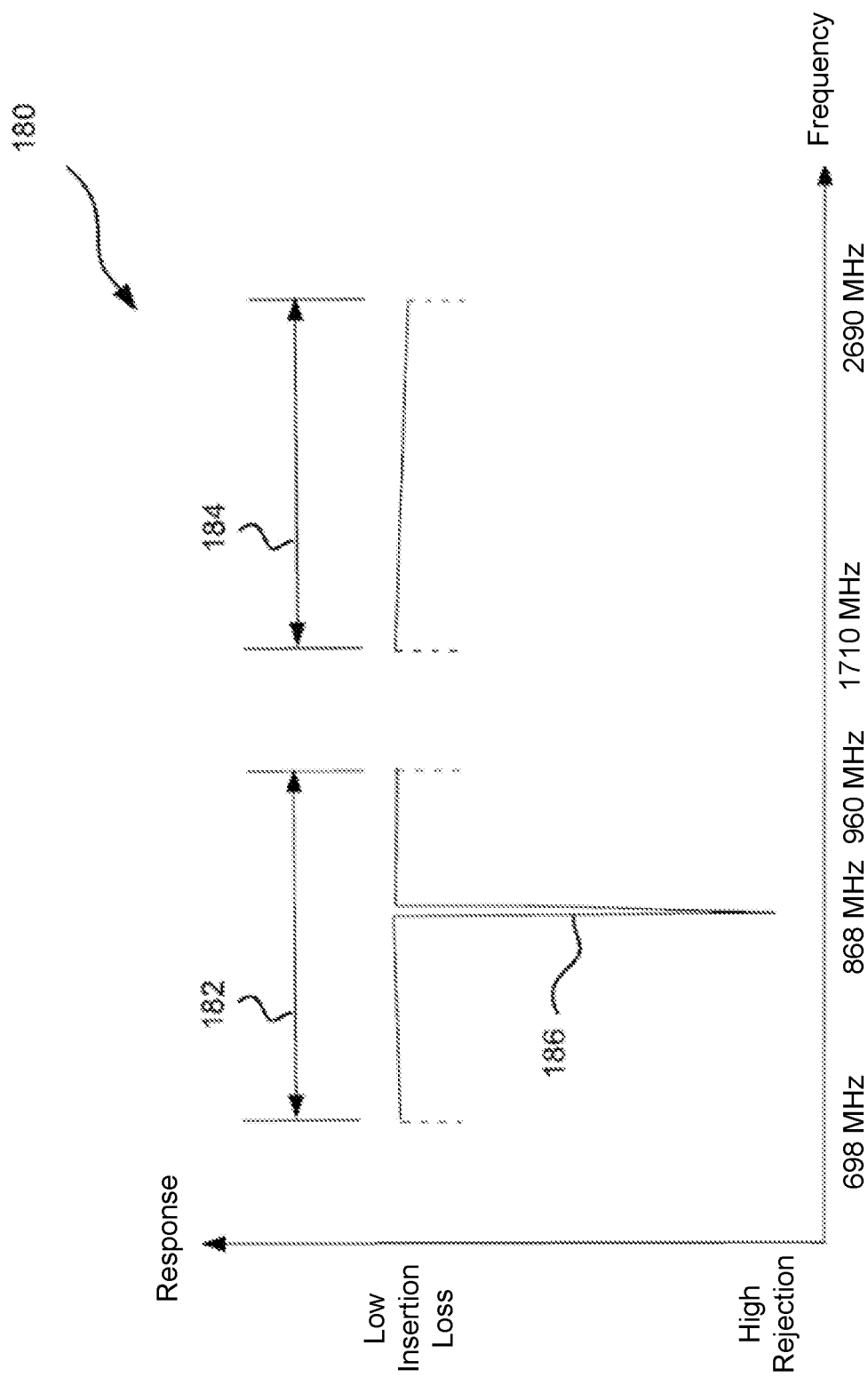
FIG. 1B is an example graph of power versus frequency of example radio transmissions of a cellular transceiver in the example wireless communication device of FIG. 1A.

FIG. 1B is one non-limiting example graph 180 of power versus frequency of the radio transmissions 112 of the second transceiver 106 in the wireless communication device 100 of FIG. 1A. The example graph 180 includes a low frequency range 182 of 698 MHz to 960 MHz and a high frequency range 184 of 1710 MHz to 2690 MHz. Accordingly, the low frequency range 182 and the high frequency range 184 are non-overlapping. In this non-limiting aspect, the low frequency range 182 corresponds to the frequencies that are routed through the first frequency path 114 and output by an output signal of the first frequency path 114, and the high frequency range 184 corresponds to the frequencies that are routed through the second frequency path 116 and output by an output signal of the second frequency path 116. Accordingly, in this non-limiting aspect, the set of frequencies passed through the first frequency path 114 are lower than the set of frequencies passed through the second frequency path 116. Further, in this non-limiting aspect, the filter 118 in the first frequency path 114 is a notch filter that causes a notch 186 (e.g., at 868 MHz) in the low frequency range 182. As such, the filter 118 provides high rejection at the notch 186 (e.g., at 868 MHz), but otherwise results in acceptable and low insertion loss in the low frequency range 182. However, the filter 118 may have a frequency response in the high frequency range 184 that would result in unacceptable insertion loss, hence the second frequency path 116 is configured to route the high frequency range 184 and provide acceptable and low insertion loss in the high frequency range 184.

Figure 2:
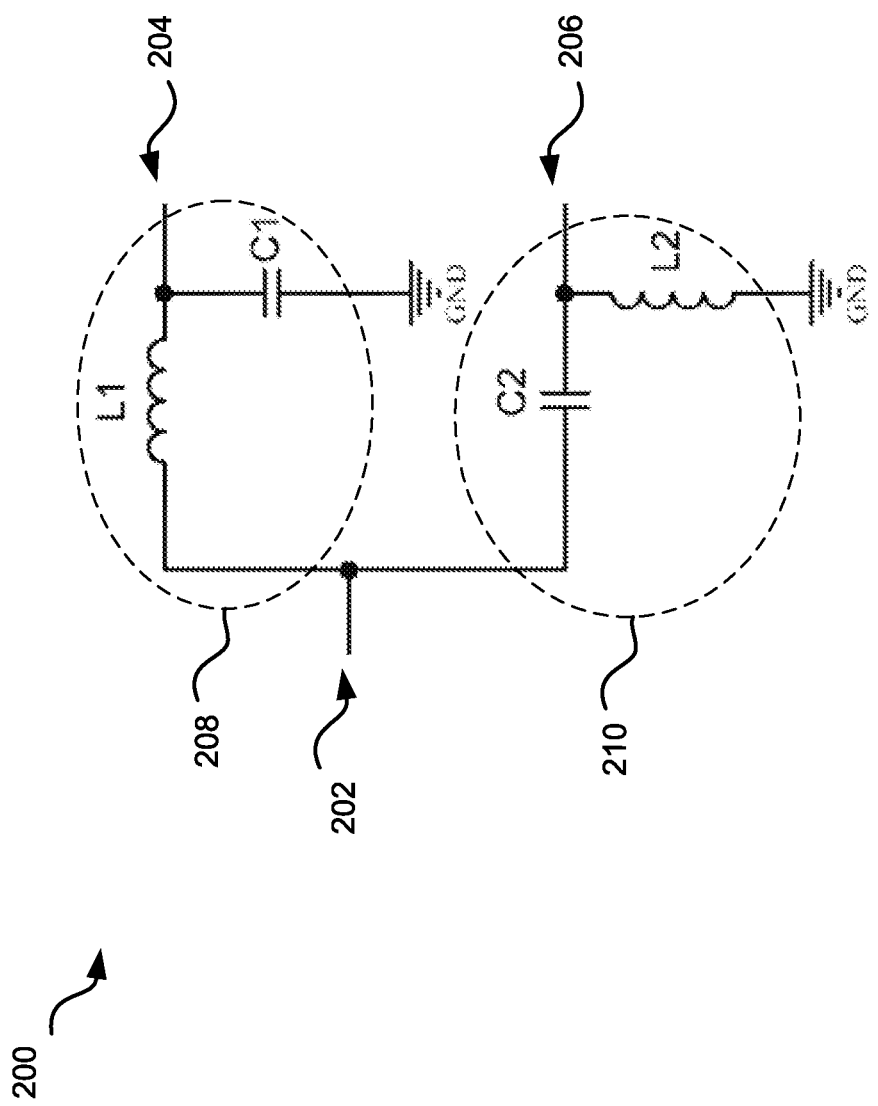
FIG. 2 is a schematic diagram of an example diplexer that may be implemented in a filter circuit of the example wireless communication device of FIG. 1A.

Referring to FIG. 2, in an aspect, for example, a diplexer 200 may be used to provide two separate frequency paths in the filter circuit 108 (FIG. 1A). For example, in an aspect, the diplexer 200 may split an input signal 202 into a low frequency signal 204 and a high frequency signal 206, thereby providing two separate frequency paths in parallel to one another. In an aspect, a reverse diplexer may also be used to recombine the two frequency paths together to provide an output signal of the filter circuit 108 (FIG. 1A).

Specifically, in one non-limiting aspect, for example, the diplexer 200 may include a low pass filter 208 and a high pass filter 210 configured in parallel to one another. The low pass filter 208 may be configured to provide the low frequency signal 204 by presenting high impedance to frequencies in the input signal 202 that are higher than a low frequency threshold and blocking such frequencies. Further, the high pass filter 210 may be configured to provide the high frequency signal 206 by presenting high impedance to frequencies in the input signal 202 that are lower than a high frequency threshold and blocking such frequencies. In an aspect, the high frequency threshold of the high pass filter 210 may be configured to be greater than or equal to the low frequency threshold of the low pass filter 208 to provide a transition band so that no frequencies in the input signal 202 are passed by both the low pass filter 208 and the high pass filter 210. In an aspect, for example, the high frequency threshold of the high pass filter 210 may be greater than the low frequency threshold of the low pass filter 208 so that no frequencies in the range of frequencies between the low frequency threshold of the low pass filter 208 and the high frequency threshold of the high pass filter 210 are passed by both the low pass filter 208 and the high pass filter 210.

In one non-limiting aspect, for example, the difference between the high frequency threshold of the high pass filter 210 and the low frequency threshold of the low pass filter 208 may affect the ease or feasibility of designing the diplexer 200. For example, a large difference between the high frequency threshold of the high pass filter 210 and the low frequency threshold of the low pass filter 208 may allow for a more gradual (not sharp) transition, which may be implemented/provided by a simpler diplexer.

Figure 3:
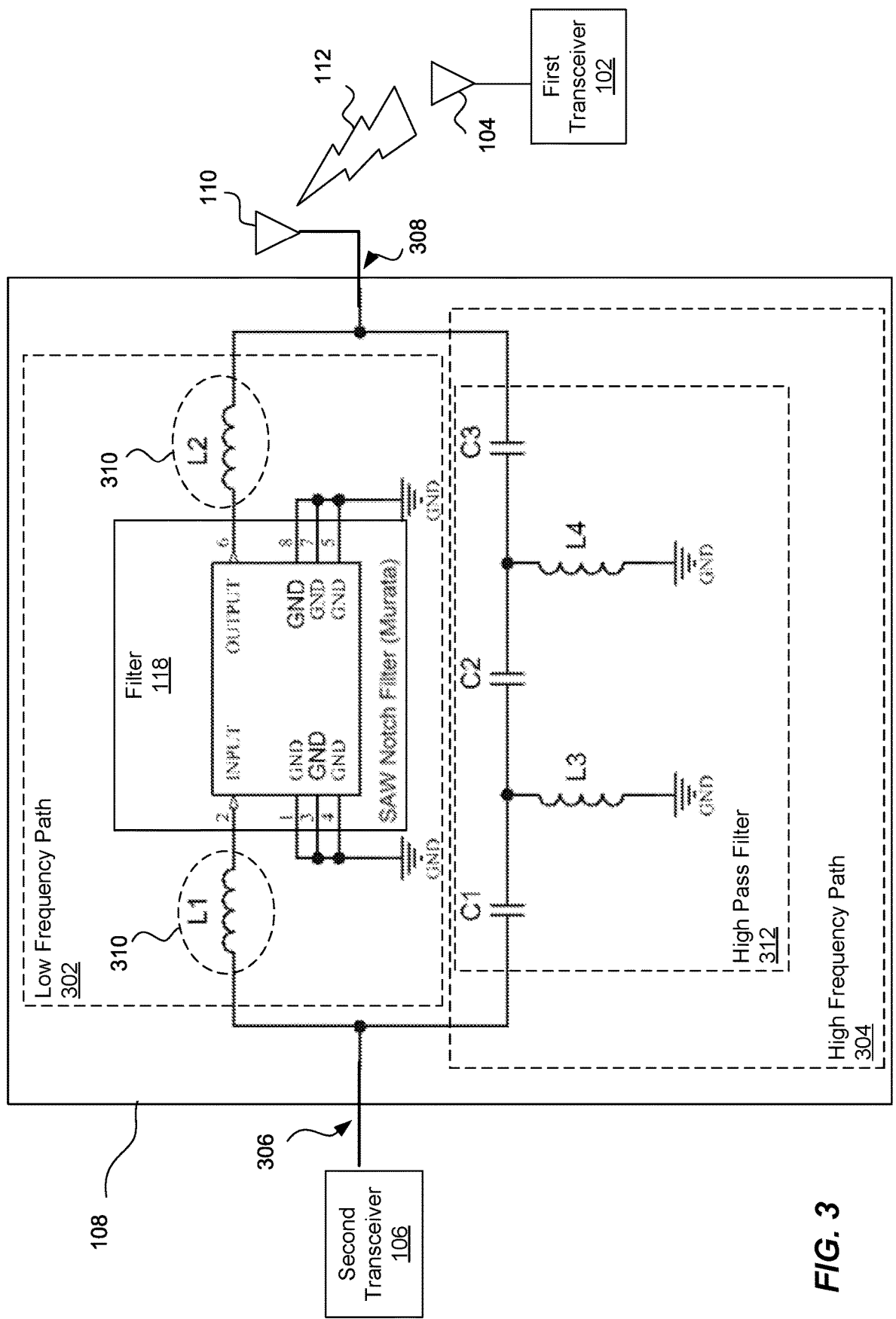
FIG. 3 is a schematic diagram of the example wireless communication device of FIG. 1A that includes a first example filter circuit.

Referring to FIG. 3, in one non-limiting aspect, for example, the filter 118 in the filter circuit 108 may be a notch filter that causes acceptable insertion loss to the second transceiver 106 at frequencies that are close to the notch frequency of the filter 118, but also causes unacceptable insertion loss to the second transceiver 106 at frequencies that are far from the notch frequency of the filter 118. For example, in an aspect, the filter 118 may be a relatively inexpensive Murata® surface acoustic wave (SAW) notch filter that satisfies the insertion loss requirements of the second transceiver 106 in the lower cellular band frequencies (e.g., 698-960 MHz) but not in the upper cellular band frequencies (e.g., 1710-2690 MHz). In this case, the filter 118 may be configured in a low frequency path 302 of the filter circuit 108, and a high frequency path 304 of the filter circuit 108 may be configured in parallel to the low frequency path 302 such that the higher cellular band frequencies of the input signal 306 pass through the high frequency path 304 of the filter circuit 108 but not through the low frequency path 302 of the filter circuit 108. For example, in an aspect, the high frequency path 304 may include a high pass filter 312 configured to pass the higher cellular band frequencies of the input signal 306 but block the lower cellular band frequencies of the input signal 306.

Since the lower cellular band frequencies of the input signal 306 are directed through the low frequency path 302, the filter 118 may be configured to block one or more operating frequencies associated with the first transceiver 102 and falling within the lower cellular band frequencies, while causing acceptable insertion loss to the second transceiver 106 at such low frequencies. The low frequency path 302 and the high frequency path 304 may also be re-combined to provide an output signal 308 of the filter circuit 108. Accordingly, the filter circuit 108 may satisfy the insertion loss requirements of the second transceiver 106 both at the lower cellular band frequencies and at the upper cellular band frequencies. Therefore, the combination of the low frequency path 302 and the high frequency path 304 allows for extending the bandwidth of the filter 118 for transceiver co-existence filtering without causing unacceptable insertion loss.

Figure 4:
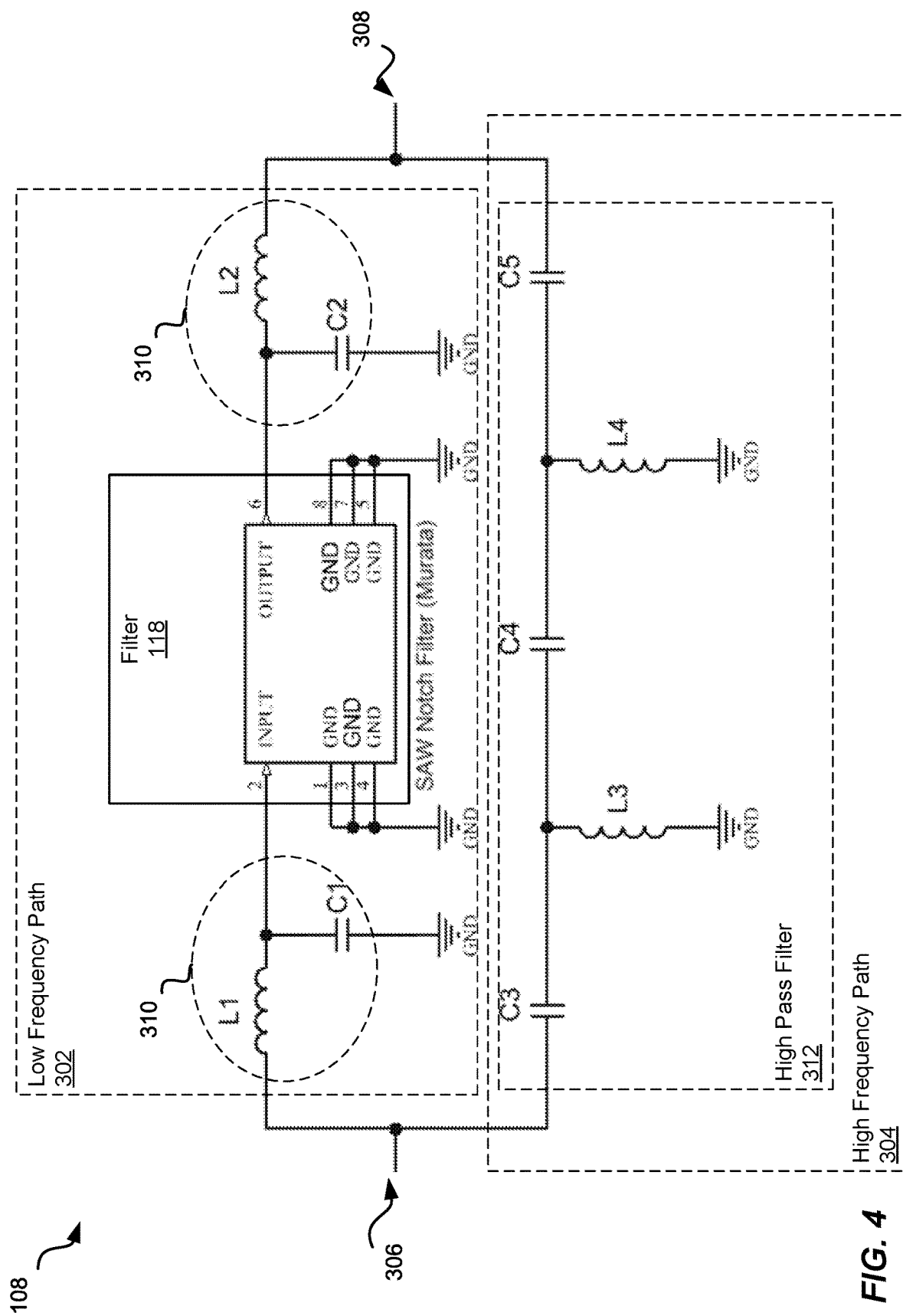
FIG. 4 is a schematic diagram of a second example filter circuit which may be implemented within the example wireless communication device of FIG. 1A.

Referring to FIG. 4, an alternative aspect of the filter circuit 108 also implements the low frequency path 302 in parallel to the high frequency path 304. Similar to the aspect described above with reference to FIG. 3, the filter 118 in the filter circuit 108 in FIG. 4 may also be a notch filter configured in the low frequency path 302 and providing acceptable insertion loss at frequencies that are close to the notch frequency of the filter 118, but unacceptable insertion loss at frequencies that are far from the notch frequency of the filter 118. For example, in an aspect, the filter 118 may be a relatively inexpensive Murata® SAW notch filter that satisfies the insertion loss requirements of the second transceiver 106 (FIG. 3) in the lower cellular band frequencies (e.g., 698-960 MHz) but not in the upper cellular band frequencies (e.g., 1710-2690 MHz). Further, the high frequency path 304 may be configured such that the higher cellular band frequencies of the input signal 306 pass through the high frequency path 304 but not through the low frequency path 302. For example, in an aspect, the high frequency path 304 may include a high pass filter 312 that passes the higher cellular band frequencies of the input signal 306 but blocks the lower cellular band frequencies of the input signal 306.

Since the lower cellular band frequencies of the input signal 306 are directed through the low frequency path 302, the filter 118 may be configured to block one or more operating frequencies of the first transceiver 102 (FIG. 3) that fall within the lower cellular band frequencies, while causing acceptable insertion loss to the second transceiver 106 (FIG. 3) at such low frequencies. The low frequency path 302 and the high frequency path 304 may also be re-combined to provide an output signal 308 of the filter circuit 108. Accordingly, the filter circuit 108 may satisfy the insertion loss requirements of the second transceiver 106 (FIG. 3) both at the lower cellular band frequencies and at the upper cellular band frequencies. Therefore, the combination of the low frequency path 302 and the high frequency path 304 allows for extending the bandwidth of the filter 118 for transceiver co-existence filtering without causing unacceptable insertion loss.

Optionally, in an aspect, for example, in the filter circuit 108 in FIG. 3 or FIG. 4, the low frequency path 302 may include a low pass filter 310 implemented in series at one or both sides of the filter 118 to provide impedance matching functionality for the filter 118. In this aspect, for example, the low pass filter 310 in the low frequency path 302 of the filter circuit 108 and the high pass filter 312 in the high frequency path 304 of the filter circuit 108 may provide diplexer and/or the reverse diplexer functionality described herein with reference to FIG. 2.

Optionally, in an aspect, for example, in the filter circuit 108 in FIG. 3 or FIG. 4, the impedance matching functionality implemented by the low pass filter 310 in the low frequency path 302 and the high pass filter 312 in the high frequency path 304 may cause the filter circuit 108 to present the same impedance from the perspective of the input signal 306 and the output signal 308 of the filter circuit 108.

Optionally, in an aspect, for example, in the filter circuit 108 in FIG. 3 or FIG. 4, further impedance matching elements may be added to the low frequency path 302 to improve performance of the filter circuit 108. However, the resulting insertion loss to the second transceiver 106 needs to remain acceptable at the highest cellular frequencies that pass through the low frequency path 302.

Optionally, in an aspect, the filter circuit 108 in FIG. 3 or FIG. 4 may be used, for example, to provide transceiver co-existence filtering for concurrent operation of a cellular transceiver with an ISM transceiver that operates according to a radio technology with sub-GHz operating frequencies, such as a PowerG transceiver, a Z-Wave transceiver, etc.

Optionally, in an aspect, for example, the filter 118 in the low frequency path 302 in FIG. 3 or FIG. 4 may be a muRata® SF2472E 869 MHz low-loss SAW filter with a maximum insertion loss of less than or equal 2.9 dB at frequencies between 698 MHz and 1880 MHz. In this aspect, the filter circuit 108 may be used for frequencies up to 2170 MHz and possibly up to 2690 MHz, but the muRata® SF2472E 869 MHz low-loss SAW filter may not have the same low insertion loss at such higher frequencies. However, the parallel paths in the filter circuit 108 may be configured to allow for acceptable insertion loss at the higher frequencies by routing such frequencies through the high frequency path 304.

Optionally, in an aspect, for example, the filter 118 in the low frequency path 302 in FIG. 3 or FIG. 4 may be a muRata® SF2471E 915 MHz low-loss SAW filter with a maximum insertion loss of less than or equal 3.1 dB at frequencies between 824 MHz and 1990 MHz. In this aspect, the filter circuit 108 may be used for frequencies down to 698 MHz as well as up to 2170 MHz and possibly up to 2690 MHz, but the muRata® SF2471E 915 MHz low-loss SAW filter may not have the same low insertion loss at the higher frequencies. However, the parallel paths in the filter circuit 108 may be configured to allow for acceptable insertion loss at the higher frequencies by routing such frequencies through the high frequency path 304.

Optionally, in an aspect, for example, the high frequency path 304 in FIG. 3 or FIG. 4 may have a discrete circuit topology. For example, in an aspect, the high frequency path 304 in FIG. 3 or FIG. 4 may be configured using very inexpensive discrete components including individual capacitors, inductors, etc.

Accordingly, the filter 118 in the low frequency path 302 of the filter circuit 108 in FIG. 3 or FIG. 4 may be implemented using a relatively low cost SAW notch filter. In one non-limiting aspect, for example, the filter 118 may be implemented with low pass filter impedance matching, via the low pass filter 310, to present high impedance at 2 GHz-3 GHz to prevent frequencies above 2 GHz from passing through the filter 118. Further, the high pass filter 312 in the high frequency path 304 may be configured to present high impedance at sub-GHz frequencies to prevent such frequencies from passing through the high frequency path 304 and only allow 2 GHz-3 GHz frequencies to pass through the high frequency path 304 with an acceptable insertion loss.

In an aspect, for example, LTE B20 and B8 radio technologies operate in sub-GHz frequencies (below 1 GHz), and Digital Cellular System (DCS), Personal Communications Service (PCS), and LTE B7 radio technologies operate at much higher frequencies close to 3 GHz, which is about 1 GHz-2 GHz away from LTE B20 and B8. However, the configuration of the filter circuit 108 in FIG. 3 or FIG. 4 allows for the filter 118 to be a relatively low cost notch filter configured to provide notch filtering functionality at sub-GHz frequencies, while the filter circuit 108 achieves acceptable filter performance both in the low frequency path 302 and in the high frequency path 304.

In an aspect, for example, the filter circuit 108 in FIG. 3 or FIG. 4 may be configured to provide good performance and acceptable insertion loss for LTE B1, B4, B3, B5, B7, B8, B12, B13, B17, and/or B20 transceivers. Therefore, the filter circuit 108 in FIG. 3 or FIG. 4 may allow for production of low cost wireless communication devices for operation in both North America and Europe. In an aspect, for example, such low cost wireless communication devices may be implemented to enhance smart home automation and alarm security systems.

Figure 5:
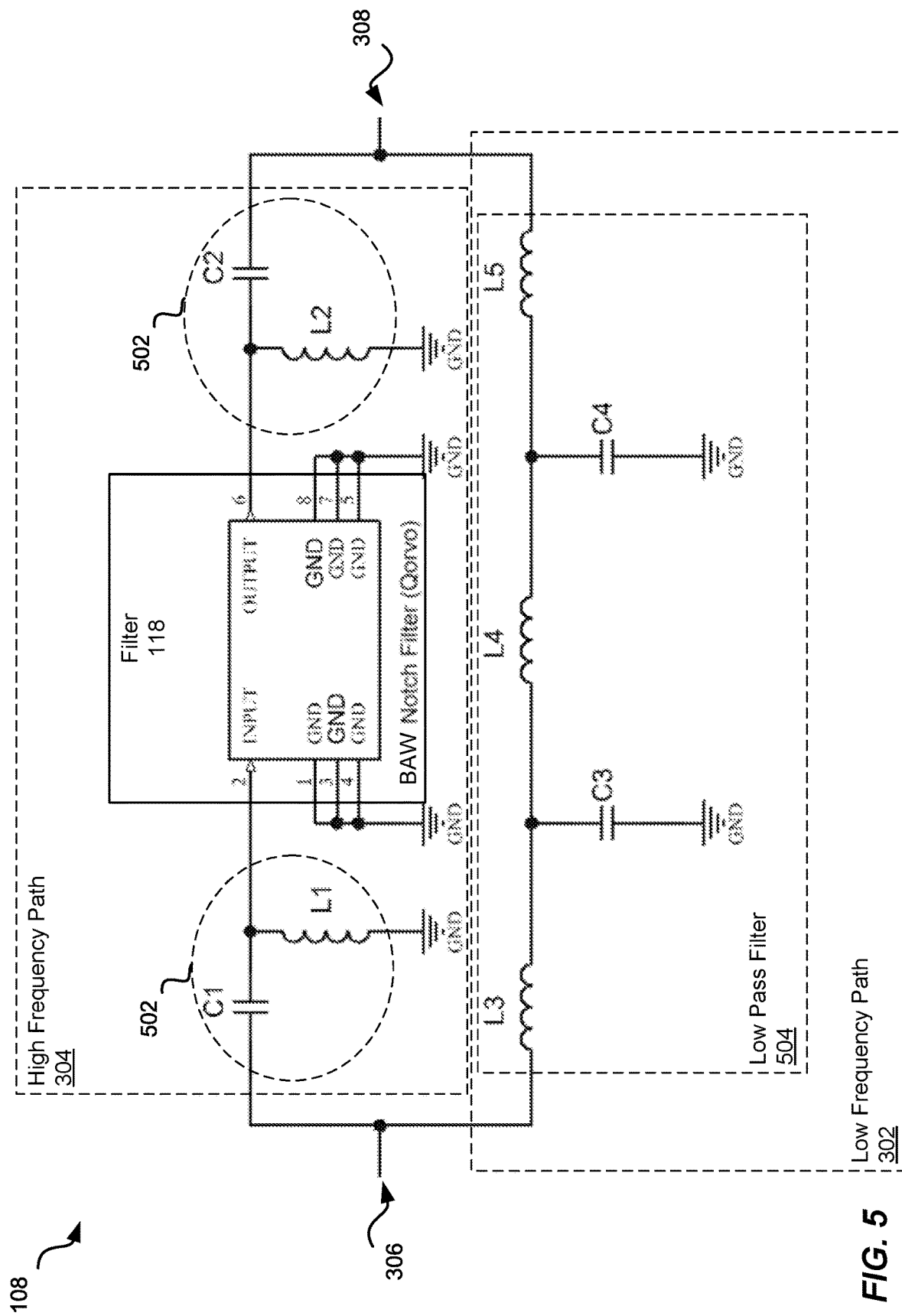
FIG. 5 is a schematic diagram of a third example filter circuit which may be implemented within the example wireless communication device of FIG. 1A.

Referring to FIG. 5, in one non-limiting alternative aspect, for example, the filter 118 in the filter circuit 108 may be configured in the high frequency path 304, and may be a notch filter that provides acceptable insertion loss at frequencies that are close to the notch frequency of the filter 118, but unacceptable insertion loss at frequencies that are far from the notch frequency of the filter 118. For example, in an aspect, the filter 118 may be a relatively inexpensive TriQuint® bulk acoustic wave (BAW) notch filter that satisfies the insertion loss requirements of the second transceiver 106 (FIG. 1A) in the upper cellular band frequencies (e.g., 1710-2690 MHz) but not in the lower cellular band frequencies (e.g., 698-960 MHz). In this case, the low frequency path 302 of the filter circuit 108 may be configured in parallel to the high frequency path 304 such that the lower cellular band frequencies of the input signal 306 pass through the low frequency path 302 of the filter circuit 108 but not through the high frequency path 304 of the filter circuit 108. For example, in an aspect, the low frequency path 302 may include a low pass filter 504 that passes the lower cellular band frequencies of the input signal 306 but blocks the upper cellular band frequencies of the input signal 306.

Since the upper cellular band frequencies of the input signal 306 are directed through the high frequency path 304, the filter 118 may be configured to block one or more operating frequencies of the first transceiver 102 (FIG. 1A) that fall within the upper cellular band frequencies, while causing acceptable insertion loss to the second transceiver 106 (FIG. 1A) at such high frequencies. The low frequency path 302 and the high frequency path 304 may also be re-combined to provide the output signal 308 of the filter circuit 108. Accordingly, the filter circuit 108 may satisfy the insertion loss requirements of the second transceiver 106 (FIG. 1A) both at the lower cellular band frequencies and at the upper cellular band frequencies. Therefore, the combination of the low frequency path 302 and the high frequency path 304 allows for extending the bandwidth of the filter 118 for transceiver co-existence filtering without causing unacceptable insertion loss.

Optionally, in an aspect, for example, the high frequency path 304 may include a high pass filter 502 implemented in series at one or both sides of the filter 118 to provide impedance matching functionality for the filter 118. In this aspect, for example, the high pass filter 502 in the high frequency path 304 of the filter circuit 108 and the low pass filter 504 in the low frequency path 302 of the filter circuit 108 may provide the diplexer and/or the reverse diplexer functionality described herein with reference to FIG. 2.

Optionally, in an aspect, for example, the impedance matching functionality implemented by the high pass filter 502 in the high frequency path 304 of the filter circuit 108 and the low pass filter 504 in the low frequency path 302 of the filter circuit 108 may cause the filter circuit 108 to present the same impedance from the perspective of the input signal 306 and the output signal 308 of the filter circuit 108.

Optionally, in an aspect, for example, further impedance matching elements may be added to the high frequency path 304 to improve performance, given that the resulting insertion loss performance of the filter circuit 108 is acceptable at the lowest cellular frequencies that pass through the high frequency path 304.

Optionally, in an aspect, the filter circuit 108 provided in FIG. 5 may be used, for example, to provide transceiver co-existence filtering for concurrent operation of a cellular transceiver with an ISM transceiver that operates according to a radio technology with above 1 GHz operating frequencies, such as a Wi-Fi transceiver, a ZigBee transceiver, a Bluetooth transceiver, etc.

Optionally, in an aspect, for example, the filter 118 in the high frequency path 304 in FIG. 5 may be a TriQuint® 885008 2440 GHz high performance BAW filter with a maximum insertion loss of less than or equal to 3.2 dB at frequencies between 2496 MHz and 2700 MHz. In this aspect, the filter circuit 108 may be configured such that frequencies greater than 1710 MHz are routed through the high frequency path 304, while lower frequencies such as frequencies in the range of 698-960 MHz are routed through the low frequency path 302. Accordingly, the parallel paths in the filter circuit 108 allow for acceptable insertion loss at the lower frequencies by routing such frequencies through the low frequency path 302.

Optionally, in an aspect, for example, the filter 118 in the high frequency path 304 in FIG. 5 may be a TriQuint® 885010 2442 GHz high performance BAW filter with a maximum insertion loss of less than or equal to 4.5 dB at frequencies between 2305 MHz and 2690 MHz. In this aspect, the filter circuit 108 may be configured such that frequencies greater than 1710 MHz are routed through the high frequency path 304, while lower frequencies such as frequencies in the range of 698-960 MHz are routed through the low frequency path 302. Accordingly, the parallel paths in the filter circuit 108 allow for acceptable insertion loss at the lower frequencies by routing such frequencies through the low frequency path 302.

Optionally, in an aspect, for example, the low frequency path 302 in FIG. 5 may have a discrete circuit topology. For example, in an aspect, the high frequency path 304 in FIG. 5 may be configured using very inexpensive discrete components including individual capacitors, inductors, etc.

Figure 6:
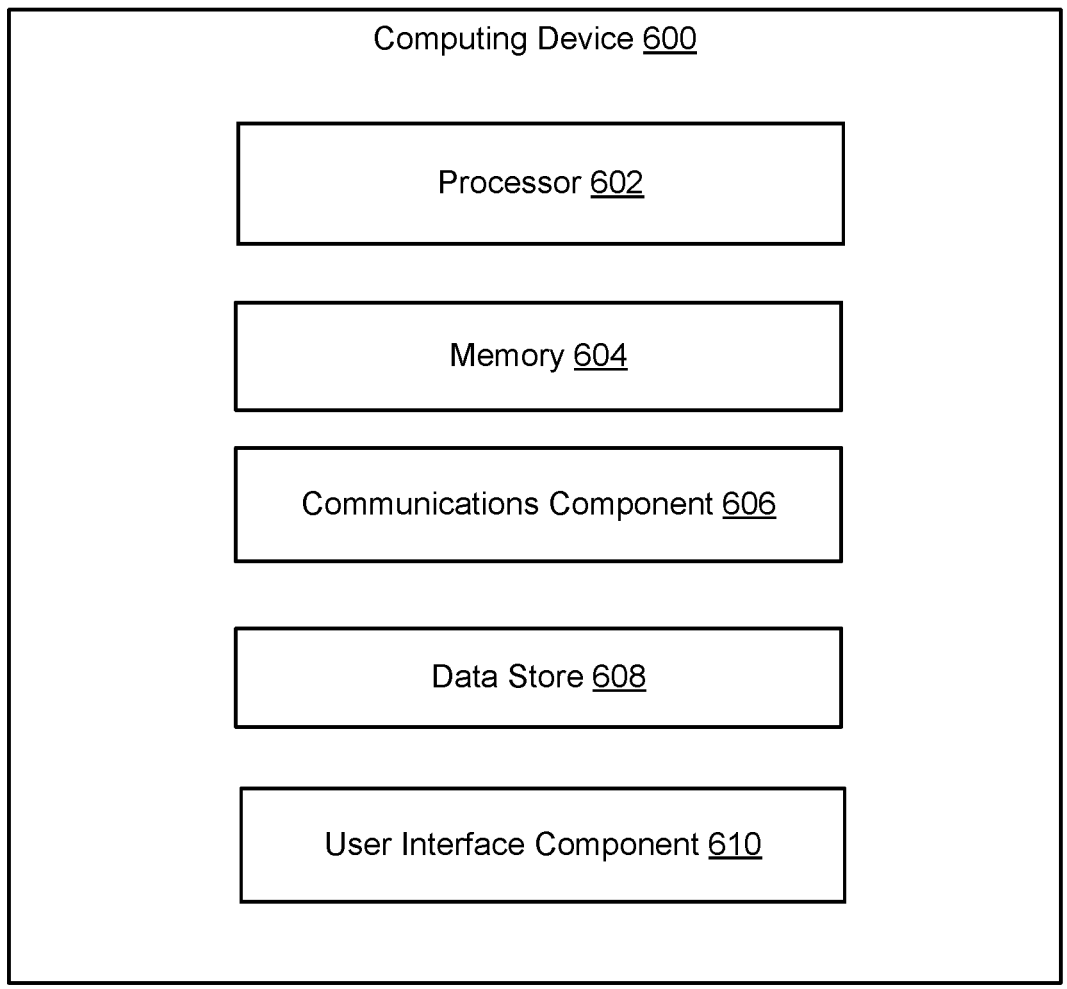
FIG. 6 is a block diagram of an example computing device which may implement the example wireless communication device of FIG. 1A and/or a component in the example wireless communication device of FIG. 1A.

Referring to FIG. 6, a computing device 600 may implement all or a portion of the functionality described in FIGS. 1A, 1B, and 2-5 above. For example, the computing device 600 may be or may include at least a portion of the wireless communication device 100 or any other component described herein with reference to FIGS. 1A, 1B, and 2-5 above. The computing device 600 includes a processor 602 which may be configured to execute or implement software, hardware, and/or firmware modules that perform any functionality described herein with reference to the wireless communication device 100 described herein with reference to FIG. 1A above.

The processor 602 may be a micro-controller, an application-specific integrated circuit (ASIC), or a field-programmable gate array (FPGA), and/or may include a single or multiple set of processors or multi-core processors. Moreover, the processor 602 may be implemented as an integrated processing system and/or a distributed processing system. The computing device 600 may further include a memory 604, such as for storing local versions of applications being executed by the processor 602, related instructions, parameters, etc. The memory 604 may include a type of memory usable by a computer, such as random access memory (RAM), read only memory (ROM), tapes, magnetic discs, optical discs, volatile memory, non-volatile memory, and any combination thereof. Additionally, the processor 602 and the memory 604 may include and execute an operating system executing on the processor 602, one or more applications, display drivers, etc., and/or other components of the computing device 600.

Further, the computing device 600 may include a communications component 606 that provides for establishing and maintaining communications with one or more other devices, parties, entities, etc. utilizing hardware, software, and services. The communications component 606 may carry communications between components on the computing device 600, as well as between the computing device 600 and external devices, such as devices located across a communications network and/or devices serially or locally connected to the computing device 600. For example, the computing device 600 may implement the wireless communication device 100 in FIG. 1A, in which case the communications component 606 may include the first transceiver 102, the second transceiver 106, the first transceiver antenna 104, the second transceiver antenna 110, the filter circuit 108, the filter 118, and/or any other components described herein with reference to FIGS. 1A, 1B, and 2-5 above.

In an aspect, for example, the communications component 606 may include one or more buses, and may further include transmit chain components and receive chain components associated with a wireless or wired transmitter and receiver, respectively, operable for interfacing with external devices. For example, in an aspect, the computing device 600 may implement the wireless communication device 100 in FIG. 1A, in which case the communications component 606 may include transmit chain components and receive chain components associated with a wireless transmitter and receiver, respectively, and operable for implementing the first transceiver 102 and/or the second transceiver 106.

Additionally, the computing device 600 may include a data store 608, which can be any suitable combination of hardware and/or software, that provides for mass storage of information, databases, and programs. For example, the data store 608 may be or may include a data repository for applications and/or related parameters not currently being executed by processor 602. In addition, the data store 608 may be a data repository for an operating system, application, display driver, etc., executing on the processor 602, and/or one or more other components of the computing device 600.

The computing device 600 may also include a user interface component 610 operable to receive inputs from a user of the computing device 600 and further operable to generate outputs for presentation to the user (e.g., via a display interface to a display device). The user interface component 610 may include one or more input devices, including but not limited to a keyboard, a number pad, a mouse, a touch-sensitive display, a navigation key, a function key, a microphone, a voice recognition component, or any other mechanism capable of receiving an input from a user, or any combination thereof. Further, the user interface component 610 may include one or more output devices, including but not limited to a display interface, a speaker, a haptic feedback mechanism, a printer, any other mechanism capable of presenting an output to a user, or any combination thereof.

As disclosed, for example, with reference to FIG. 1A above, the present aspects provide a wireless communication device 100 that includes a first transceiver 102 operable according to a first radio technology including one or more operating frequencies, and a second transceiver 106 operable according to a second radio technology different than the first radio technology. The second transceiver 106 is operable concurrently with the first transceiver 102. The wireless communication device 100 also includes a second transceiver antenna 110 configured to transmit radio transmissions 112 of the second transceiver 106.

The wireless communication device 100 also includes a filter circuit 108 coupling the second transceiver 106 with the second transceiver antenna 110. The filter circuit 108 includes a first frequency path 114 and a second frequency path 116 configured in parallel to one another.

The first frequency path 114 is configured to pass a first set of frequencies of the radio transmissions 112 and the second frequency path 116 is configured to pass a second set of frequencies of the radio transmissions 112, where the first set of frequencies are less than and non-overlapping with the second set of frequencies. The first frequency path 114 is configured to filter the radio transmissions 112 of the second transceiver 106 to remove signals corresponding to the one or more operating frequencies of the first transceiver 102 from the radio transmissions 112 of the second transceiver 106.

In an aspect, for example, the first transceiver 102 is an ISM radio band transceiver, and the second transceiver 106 is a cellular transceiver.

In an aspect, for example, referring now to FIGS. 1 and 2, the filter circuit 108 may include a diplexer 200 configured to split an input of the filter circuit 108 into the first frequency path 114 and the second frequency path 116. The filter circuit 108 may also include a reverse diplexer configured to generate an output of the filter circuit 108 by combining the first frequency path 114 and the second frequency path 116.

In an aspect, for example, referring now to FIG. 3 or FIG. 4, the filter circuit 108 may include a low frequency path 302 that includes a filter 118 configured to remove the signals corresponding to a first frequency (e.g., the one or more operating frequencies of the first transceiver 102) from the radio transmissions 112 of the second transceiver 106. The filter circuit 108 also includes a high frequency path 304 in parallel to the low frequency path 302.

In one non-limiting aspect, for example, the filter 118 may be an SAW notch filter.

In an aspect, for example, the filter 118 causes a first insertion loss to the second transceiver 106 at the first frequency, where the first insertion loss is less than a first acceptable insertion loss threshold associated with the second transceiver 106 at the first frequency. The filter 118 causes a second insertion loss to the second transceiver 106 at a second frequency, where the second insertion loss is greater than a second acceptable insertion loss threshold associated with the second transceiver 106 at the second frequency.

In an aspect, for example, the low frequency path 302 further includes a low pass filter 310 configured to block the second frequency, and the high frequency path 304 is configured to pass the second frequency. In an aspect, for example, the high frequency path 304 includes a high pass filter 312 configured to pass the second frequency and block the first frequency. In an aspect, for example, the first frequency is a sub-GHZ frequency, and the second frequency is above 1.7 GHz. In an aspect, for example, the low pass filter 310 is configured to block frequencies above 1.7 GHz, and the high pass filter 312 is configured to block sub-GHz frequencies. In an aspect, for example, the first radio technology of the first transceiver 102 is PowerG or Z-Wave, and the second radio technology of the second transceiver 106 is a cellular technology.

In an alternative aspect, for example, referring to FIG. 5, the high frequency path 304 of the filter circuit 108 includes a filter 118 configured to remove the signals corresponding to a first frequency (e.g., the one or more operating frequencies of the first transceiver 102) from the radio transmissions 112 of the second transceiver 106. The filter circuit 108 also includes a low frequency path 302 in parallel to the high frequency path 304.

In an aspect, for example, the filter 118 may be a BAW notch filter.

In an aspect, for example, the filter 118 causes a first insertion loss to the second transceiver 106 at the first frequency, where the first insertion loss is less than a first acceptable insertion loss threshold associated with the second transceiver 106 at the first frequency. The filter 118 also causes a second insertion loss to the second transceiver 106 at a second frequency, where the second insertion loss is greater than a second acceptable insertion loss threshold associated with the second transceiver 106 at the second frequency.

In an aspect, for example, the high frequency path 304 further includes a high pass filter 502 configured to block the second frequency, and the low frequency path 302 is configured to pass the second frequency. In an aspect, for example, the low frequency path 302 includes a low pass filter 504 configured to pass the second frequency and block the first frequency. In an aspect, for example, the first frequency is above 1.7 GHz, and the second frequency is a sub-GHZ frequency. In an aspect, for example, the low pass filter 504 is configured to block frequencies above 1.7 GHz, and the high pass filter 502 is configured to block sub-GHz frequencies. In an aspect, for example, the first radio technology of the first transceiver 102 is Wi-Fi, ZigBee, or Bluetooth, and the second radio technology of the second transceiver 106 is a cellular technology.

As disclosed, referring back to FIG. 1A, in an aspect, the filter circuit 108 couples the second transceiver 106 with the second transceiver antenna 110 that is configured to transmit the radio transmissions 112 of the second transceiver 106. The filter circuit 108 includes an input path 120 configured to receive an output signal of the second transceiver 106. The filter circuit 108 further includes a first frequency path 114 connected to the input path 120 and including a filter 118 configured to block out a first frequency from the output signal of the second transceiver 106 to define a first path output signal. The filter 118 causes a first insertion loss at the first frequency in the first path output signal, where the first insertion loss is less than a first acceptable insertion loss threshold associated with the second transceiver 106 at the first frequency. The filter 118 also causes a second insertion loss at a second frequency in the first path output signal, where the second insertion loss is greater than a second acceptable insertion loss threshold associated with the second transceiver 106 at the second frequency.

The filter circuit 108 further includes a second frequency path 116 connected to the input path 120 and configured in parallel with the first frequency path 114. The second frequency path 116 is configured to block the first frequency and pass the second frequency to define a second path output signal.

The filter circuit 108 further includes an output path 122 connected to the first frequency path 114 and the second frequency path 116 and connectable to the second transceiver antenna 110, where the output path 122 is configured to receive and output the first path output signal of the first frequency path 114 and the second path output signal of the second frequency path 116.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A wireless communication device, comprising:
a first transceiver operable according to a first radio technology;
an antenna configured to transmit radio transmissions of the first transceiver; and
a filter circuit coupling the first transceiver with the antenna, wherein the filter circuit is configured to split an input of the filter circuit into two frequency paths comprising a first frequency path and a second frequency path in parallel to one another, wherein the filter circuit is further configured to generate an output of the filter circuit by combining the first frequency path with the second frequency path, wherein the first frequency path is configured to pass a first set of frequencies of the radio transmissions and the second frequency path is configured to pass a second set of frequencies of the radio transmissions, wherein the first set of frequencies are at least partially non-overlapping with the second set of frequencies, wherein one of the two frequency paths is configured to cause a first insertion loss to the first transceiver at a first frequency and to cause a second insertion loss to the first transceiver at a second frequency, wherein the first insertion loss is less than a first acceptable insertion loss threshold associated with the first transceiver at the first frequency, wherein the second insertion loss is greater than a second acceptable insertion loss threshold associated with the first transceiver at the second frequency.

2. The wireless communication device of claim 1, further comprising a second transceiver operable according to a second radio technology that comprises one or more operating frequencies and is different than the first radio technology, wherein the second transceiver is configured to be operable concurrently with the first transceiver, wherein one of the first frequency path or the second frequency path is configured to filter the radio transmissions of the first transceiver to remove signals corresponding to the one or more operating frequencies of the second transceiver from the radio transmissions of the first transceiver.

3. The wireless communication device of claim 1, wherein the first frequency path comprises a filter configured to remove signals corresponding to the first frequency from the radio transmissions of the first transceiver.

4. The wireless communication device of claim 3, wherein the filter comprises a surface acoustic wave "SAW" notch filter.

5. The wireless communication device of claim 3, wherein the filter causes the first insertion loss to the first transceiver at the first and causes the second insertion loss to the first transceiver at the second frequency.

6. The wireless communication device of claim 5, wherein the first frequency path further comprises a low pass filter configured to block the second frequency, wherein the second frequency path is configured to pass the second frequency.

7. The wireless communication device of claim 6, wherein the second frequency path comprises a high pass filter configured to pass the second frequency and block the first frequency.

8. The wireless communication device of claim 7, wherein the first frequency comprises a sub-GHZ frequency, and wherein the second frequency is above 1.7 GHz.

9. The wireless communication device of claim 7, wherein the low pass filter is configured to block frequencies above 1.7 GHz, and wherein the high pass filter is configured to block sub-GHz frequencies.

10. The wireless communication device of claim 2, wherein the second radio technology comprises PowerG or Z-Wave, wherein the first radio technology comprises a cellular technology.

11. The wireless communication device of claim 1, wherein the second frequency path comprises a filter configured to remove signals corresponding to the first frequency from the radio transmissions of the first transceiver.

12. The wireless communication device of claim 11, wherein the filter comprises a bulk acoustic wave "BAW" notch filter.

13. The wireless communication device of claim 11, wherein the filter causes the first insertion loss to the first transceiver at the first frequency, and causes the second insertion loss to the first transceiver at the second frequency.

14. The wireless communication device of claim 13, wherein the second frequency path further comprises a high pass filter configured to block the second frequency, wherein the first frequency path is configured to pass the second frequency.

15. The wireless communication device of claim 14, wherein the first frequency path comprises a low pass filter configured to pass the second frequency and block the first frequency.

16. The wireless communication device of claim 15, wherein the first frequency is above 1.7 GHz, wherein the second frequency comprises a sub-GHZ frequency.

17. The wireless communication device of claim 15, wherein the low pass filter is configured to block frequencies above 1.7 GHz, wherein the high pass filter is configured to block sub-GHz frequencies.

18. The wireless communication device of claim 2, wherein the second radio technology comprises Wi-Fi, ZigBee, or Bluetooth, wherein the first radio technology comprises a cellular technology.

19. The wireless communication device of claim 2, wherein the second transceiver comprises an Industrial, Scientific, and Medical "ISM" radio band transceiver, wherein the first transceiver comprises a cellular transceiver.

20. A filter circuit comprising:
an input path configured to receive an output signal of a transceiver;
a first frequency path connected to the input path and including a filter configured to block out a first frequency from the output signal of the transceiver to define a first path output signal, wherein the filter causes a first insertion loss at the first frequency in the first path output signal, wherein the first insertion loss is less than a first acceptable insertion loss threshold associated with the transceiver at the first frequency, wherein the filter causes a second insertion loss at a second frequency in the first path output signal, wherein the second insertion loss is greater than a second acceptable insertion loss threshold associated with the transceiver at the second frequency;
a second frequency path connected to the input path and configured in parallel with the first frequency path, wherein the second frequency path is configured to block the first frequency and pass the second frequency to define a second path output signal; and
an output path connected to the first frequency path and the second frequency path and connectable to an antenna, wherein the output path is configured to receive and output the first path output signal of the first frequency path and the second path output signal of the second frequency path.

21. A wireless communication device, comprising:
a first transceiver operable according to a first radio technology; and
a filter circuit configured to couple the first transceiver with an antenna operable to transmit radio transmissions of the first transceiver, wherein the filter circuit comprises a first frequency path and a second frequency path in parallel to one another, wherein the first frequency path is configured to pass a first set of frequencies and the second frequency path is configured to pass a second set of frequencies, wherein the first frequency path comprises a filter configured to remove signals corresponding to a first frequency from the radio transmissions of the first transceiver, wherein the filter causes a first insertion loss to the first transceiver at the first frequency, wherein the first insertion loss is less than a first acceptable insertion loss threshold associated with the first transceiver at the first frequency, wherein the filter causes a second insertion loss to the first transceiver at a second frequency, wherein the second insertion loss is greater than a second acceptable insertion loss threshold associated with the first transceiver at the second frequency.

22. The wireless communication device of claim 21, further comprising a second transceiver operable according to a second radio technology different than the first radio technology.

23. The wireless communication device of claim 22, wherein the second radio technology comprises one or more operating frequencies, wherein the second transceiver is configured to be operable concurrently with the first transceiver, wherein one of the first frequency path or the second frequency path is configured to filter the radio transmissions of the first transceiver to remove one or more signals corresponding to the one or more operating frequencies of the second transceiver from the radio transmissions of the first transceiver.

* * * * *